United States Patent [19]

Robinson et al.

[11] Patent Number: 4,931,907

[45] Date of Patent: Jun. 5, 1990

[54] ELECTRIC MODULE LATCH ASSEMBLY

[75] Inventors: Richard P. Robinson; Joseph S. Neilson, both of Cupertino, Calif.

[73] Assignee: Tandem Computers Incorporated, Cupertino, Calif.

[21] Appl. No.: 331,403

[22] Filed: Mar. 30, 1989

[51] Int. Cl.[5] ............................................. H05K 5/00
[52] U.S. Cl. .................................... 361/391; 200/50 R
[58] Field of Search ............. 200/50 R, 54 A, 50 AA, 200/318, 321–325; 361/331, 332, 335, 338, 339, 390, 391, 392, 415; 312/320

[56] References Cited

U.S. PATENT DOCUMENTS

| | | | |
|---|---|---|---|
| 3,575,482 | 4/1971 | MacMaster et al. | 361/391 |
| 3,919,507 | 11/1975 | Middleton, Jr. | 200/50 A |
| 3,932,716 | 1/1976 | Mottel et al. | 200/50 A |
| 4,071,722 | 1/1978 | Hart | 200/50 A |
| 4,716,495 | 12/1987 | Craker | 361/415 X |
| 4,777,332 | 10/1988 | Diaz | 200/50 A |

OTHER PUBLICATIONS

The Hartwell Corporation, H2142 Compensating Keeper Flyer (no date provided).
Camloc Chassis Latches Flyer, 21L/40L Series; 61L Series (no date provided).

*Primary Examiner*—J. R. Scott
*Attorney, Agent, or Firm*—Townsend and Townsend

[57] ABSTRACT

An electronic module (6) and integrally mounted latch assembly (2) includes a latch handle assembly (4) mounted to the module and a keeper (8) mounted to a housing (10). The latch handle assembly includes a U-shaped handle (18) having an elongate lever (42) pivotally mounted to one leg (22) of the handle at latch end (46) of the lever. The latch end has a cam surface (64) which engages the keeper. The outer, catch end (44) of the lever is configured to engage a spring-loaded catch button (50) mounted to the other leg (20) of the handle. A disenable switch pin (72) is mounted to the handle to resiliently engage the underside (80) of the lever so that when the lever is in the latched position, the lever keeps the disenable switch pin depressed. The pin is long enough to engage an enable switch (96) within the housing when so depressed. The initial movement of the lever away from, and the final movement towards, the handle permits the electrical connectors (12, 14) coupling the module and housing to be disconnected, and connected, under no-load conditions. The keeper is mounted to the housing so that it can move a short distance towards and away from the housing while being spring biased (70) towards the housing.

10 Claims, 2 Drawing Sheets

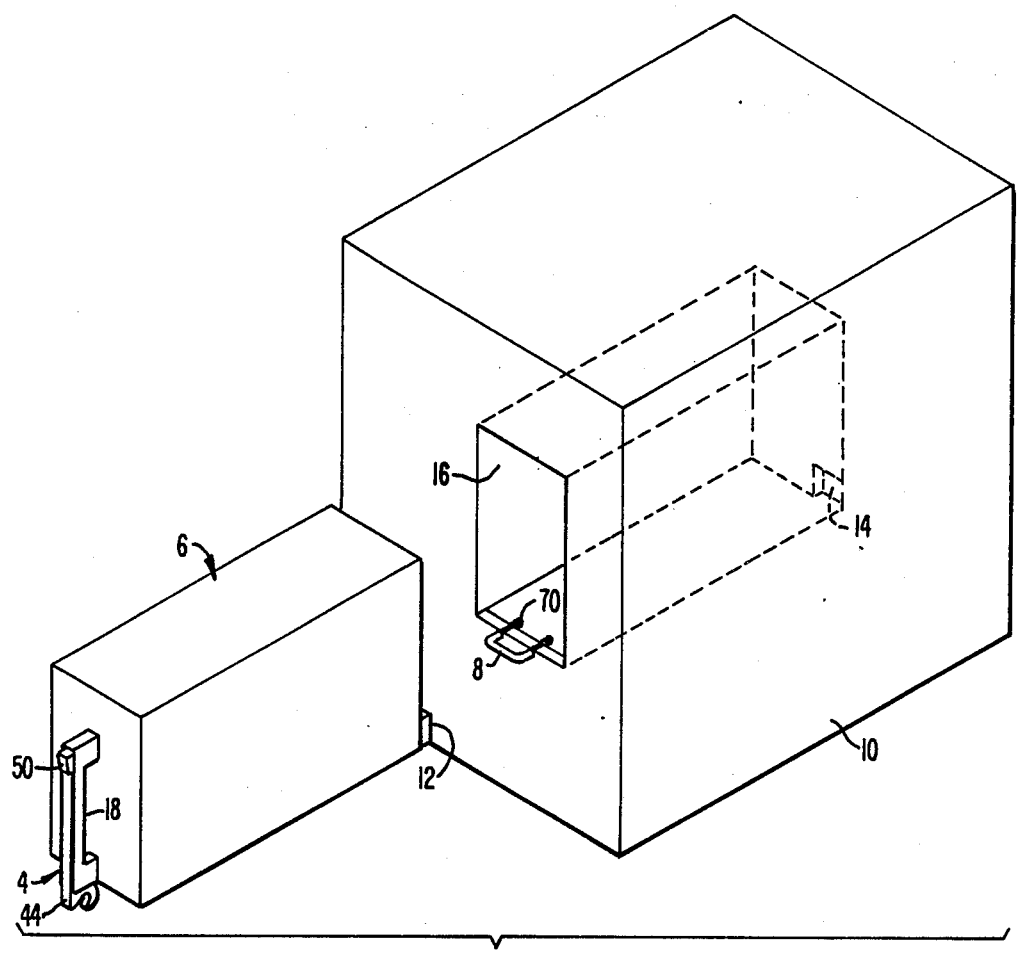
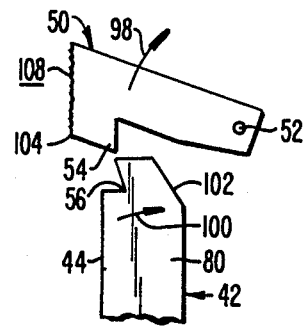
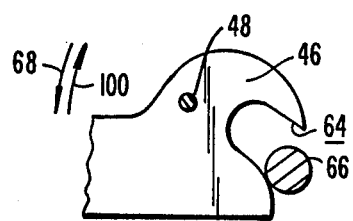
FIG._1.
FIG._4A.
FIG._4C.

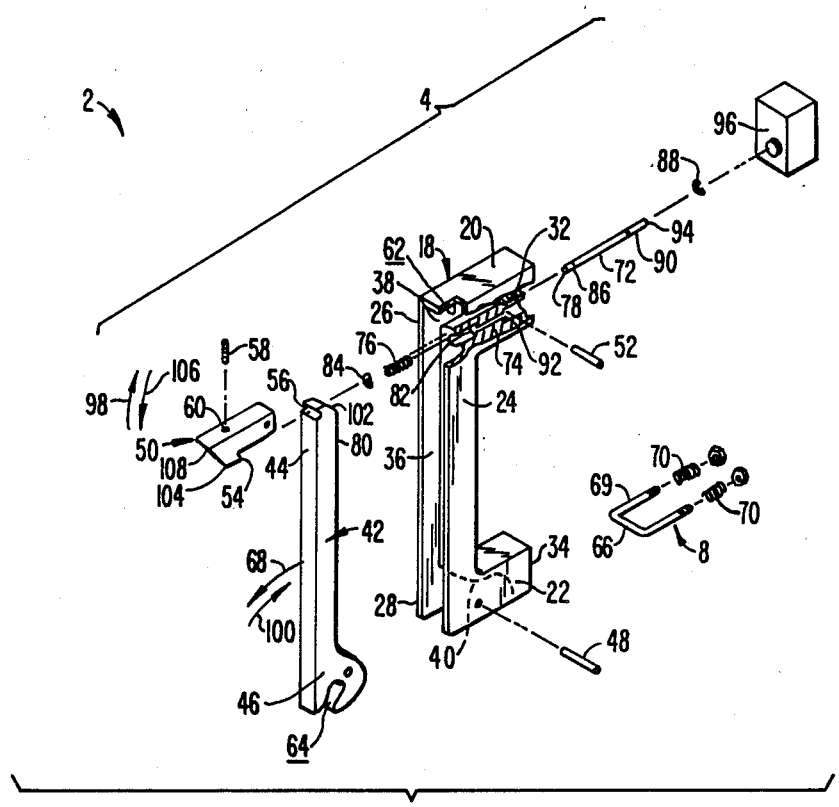
FIG._2.
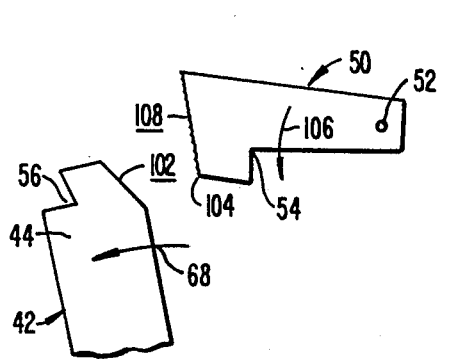
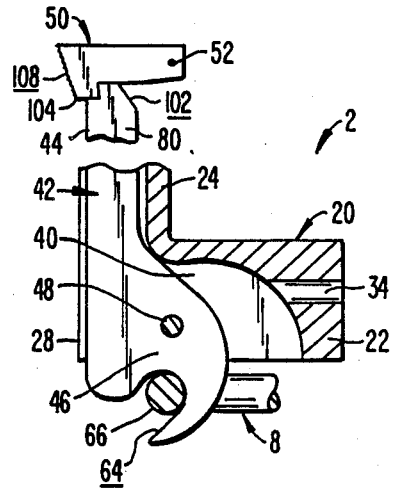
FIG._3.
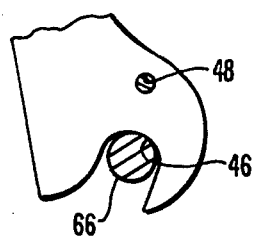
FIG._4B.

ELECTRIC MODULE LATCH ASSEMBLY

BACKGROUND OF THE INVENTION

Many electrical assemblies include a number of modules removably mounted into a main housing. These modules often carry electrical connectors which engage mating connectors in the housing when the module is fully inserted into the housing. One concern is to insure that the appropriate electrical connections are broken during a no-load condition. U.S. Pat. No. 3,919,507, issued to C. Middleton on Nov. 11, 1975, discloses an interlock system which permits the power switch to be actuated only when the two units have been interconnected. This has also been accomplished in the past through the automatic actuation of an external power switch on the module whenever the module was to be removed or replaced. See U.S. Pat. No. 4,777,332, issued to R. Diaz on Oct. 11, 1988.

SUMMARY OF THE INVENTION

The present invention is directed to an electronic module and integrally mounted latch assembly, to be housed within a housing, and includes a latch handle assembly mounted to the module and a keeper mounted to the housing. The latch handle assembly includes a U-shaped handle having first and second legs secured to the module and a bight connecting them. An elongate lever is pivotally mounted to the handle at its latch end. The latch end is configured to engage the keeper and pull the module into the housing when the lever is pivoted towards the handle. The latch end also pushes the module away from the housing when the lever is pivoted away from the handle. The other latch end of the lever is configured to engage a spring-loaded catch button mounted to the other leg of the handle.

A disenable switch pin is mounted in the handle to engage the lever, preferably at the outer, latch end of the lever. The disenable switch pin is spring biased against the lever. When the lever is in the latched position, the lever keeps the disenable switch pin depressed against the force of the spring bias. The pin is long enough to engage an enable switch, typically mounted within the interior of the module. Thus, when the lever is released by moving the catch button, the disenable switch pin moves outwardly, pushes the latch end of the lever away from the handle and releases the enable switch. The released enable switch completely, or at least partially, electrically isolates the module from the housing.

The user then continues moving the catch-end of the lever away from the handle; this causes the U-shaped internal camming surface at the latch end of the lever to push against the keeper thus driving the module from the housing. In this way, any electrical circuits are properly interrupted, due to the release of the enable switch, prior to the actual removal of the module from the housing and thus prior to the disconnection of electrical connectors carried by the module and the housing.

The keeper is preferably mounted to the housing so that it can move a short distance towards and away from the housing while being spring biased towards the housing.

The disenable switch pin and the spring biased keeper both tend to pivot the lever in the unlatching direction when the lever is in the latch position. Actuating the catch button to release the lever permits the lever to pivot in the unlatching direction. However, the spring biasing forces of the disenabled switch pin and keeper do not necessarily tend to force a module away from the housing but rather merely pivot the lever to a position where it can be grasped by the user. The user's further pivoting of the lever in the unlatching direction causes the U-shaped latch surface at the latch end of the lever to drive the module away from the housing, preferably a distance sufficient to disconnect the electrical connectors.

Because of the angle of engagement of the catch-button catch and the catch at the catch-end of the lever, the lever must be biased slightly in the latching direction (against the biasing forces of the disenable switch pin and the keeper) before the two catches release to allow the lever to pivot freely in the unlatching direction. Thus, when the lever is in the latched position with the two catches engaged, it is a stable position to help ensure continuous engagement of the electrical module within the housing until the user actively disengages the catch button from the catch end of the lever.

Another feature of the invention is the use of the spring-biased keeper. This ensures a sufficient force is exerted between the cam-latch surface and the keeper so to maintain the engagement force between the reverse angle catch of the catch button and the mating reverse angle catch of the lever regardless of the presence or absence of the disenable switch pin. The biasing force of the keeper is preferably sufficient to overcome the frictional insertion forces of the mating connectors.

A further feature of the invention is the recognition of the desirability for a latch assembly to include each of the following features: a strong carrying handle, positive latching, and the automatic operation of a disenable switch pin during latching and unlatching for no load engagement and disengagement of connectors. The present invention fulfills each of these requirements in a straightforward manner.

Other features and advantages of the present invention will appear from the following description in which the preferred embodiment has been set forth in detail in conjunction with the accompanying drawings.

BRIEF DESCRIPTION OF THE DRAWINGS

FIG. 1 is a simplified representation showing a latch assembly made according to the invention mounted to a housing and to an electrical module.

FIG. 2 is an exploded isometric assembly of the latch assembly of FIG. 1 shown in conjunction with an enable switch which is mounted within the electrical module of FIG. 1.

FIGS. 3 is an enlarged cross-sectional view of the assembly of FIGS. 1 and 2, with the lever in the latched position.

FIGS. 4A and 4B are simplified partial side views of the lever, catch button, and keeper of FIG. 3, shown with the electrical module mounted to the housing with the lever in two intermediate positions.

FIG. 4C shows the catch end of the lever and the bight of the keeper with the lever pivoted fully in the unlatching direction.

DETAILED DESCRIPTION OF THE PREFERRED EMBODIMENT

Referring now to FIGS. 1, 2, and 3, a latch assembly 2 is shown to include a latch handle assembly 4 mounted to an electrical module 6 and a keeper 8 mounted to a housing 10. Electrical module 6 is of the type including an electrical connector 12 which engages a mating electrical connector 14 within housing 10. Module 6 is sized to fit within an opening 16 in housing 10. Connectors 12, 14 are positioned so that when module 6 is fully inserted within housing 10, connectors 12, 14 mate.

Latch assembly 4 includes a U-shaped handle 18 having first and second legs 20, 22 and a bight 24 connecting the outer ends 26, 28 of legs 20, 22. Handle 18 is secured to module 6 through the use of screws (not shown) which pass through appropriate holes in module 6 and into threaded holes 32, 34 in legs 20, 22.

Handle 18 defines a slot 36 extending along bight 24. Slot 36 connects a rectangular first open region 38 formed in first leg 20 and an open-ended, arcuate bottomed second open region 40 formed in second leg 22. An elongate lever 42 having a catch end 44 and an enlarged latch end 46 is pivotally mounted to second leg by a roll pin 48, which passes through corresponding openings second leg 22 and latch end 46. Assembly 4 also includes a spring-loaded catch button 50 which is pivotally mounted to first leg 20 through a roll pin 52 passing through appropriate openings in first leg 20 and catch button 50. Catch button 50 has a reverse angle catch 54 size to engage a mating catch 56 at the catch end 44 of lever 42. Reverse angle catch 54 of catch button 50 is biased towards catch end 44 by a spring 58. One end of spring 58 is partially housed within a blind hole 60 in catch button 50 and the other is pressed against an inner wall 62 of first open region 38.

Latch end 46 includes a U-shaped camming surface 64 sized and positioned to engage the bight 66 of keeper 8, bight 66 defining a latch surface. Lever 42 is shown in its latched position, generally parallel to bight 24, in FIG. 3, at first and second intermediate positions in FIGS. 4A and 4B, and at its unlatched position in FIG. 4C. In viewing these figures, it is seen how camming surface 64 engages bight 66 of keeper 8 so to push electrical modules 6 away from housing when moving from the latched position of FIG. 3 to the unlatched position of FIG. 4C. The reverse is also true; that is, camming surface 64 pulls electrical module 6 into housing 10 as lever 42 is moved from the unlatched position of FIG. 4C to the latched position of FIG. 3.

Keeper 8 includes elongate legs 69, over which springs 70 are mounted, to spring bias bight 66 towards housing 10. Keeper 8, when lever 42 is in the latched position of FIG. 3A, tends to rotate lever 42 in an unlatching direction 68 thus forcing catch 56 into engagement with catch 54.

Latch assembly 4 also includes a disenable switch pin 72 mounted within a guidehole 74 formed in first leg 20. A spring 76, mounted over pin 72, biases switch pin 72 so the outer end 78 of pin 72 presses against the underside 80 of lever 42 at catch end 44. This is achieved in the preferred embodiment by capturing spring 76 between a counterbored shoulder 82 adjacent guide hole 74 and a clip 84 secured to pin 72 at a groove 86 in pin 72. The amount of travel of pin 72 towards lever 42 is restricted by the engagement of a second clip 88, mounted within a second groove 90 in switch pin 72, with a second counterbored surface 92.

The inner end 94 of pin 72 is positioned to extend within module 6 opposite an enable switch 96 carried by the module. When lever 42 is in the latched position of FIG. 3, disenable switch pin 72 is biased by underside 80 of lever 42 so that inner end 94 engages enable switch 96. This permits normal operation of electrical module 6. However, when catch button 50 is rotated away from its engaged position of FIG. 3 to the disengaged position of FIG. 4A, spring 76 tends to rotate lever 42 in unlatching direction 68 (see FIG. 4B) so to permit inner end 94 of pin 72 to move away from enable switch 96 to release enable switch 96; the release of enable switch 96 at least partially electrically isolates module 6 from housing 10. (Of course, there may be some live circuits which are purposely not disabled by the release of enable switch 96.) This deactuating of enable switch 96 occurs before camming surface 64 begins to move electrical module 6 from within housing 10. This ensures that no load engagement and disengagement of connectors 12, 14 is achieved.

In use, assuming module 6 is external of housing 10 with lever 42 housed within slot 36, the user can hold module 6 by handle 18, align module 6 with opening 16 and slide the module part way into the interior of housing 10. Before module is fully inserted into housing 10, lever 42 is released by biasing catch button 50 away from the latched position of FIG. 3 in the direction of arrow 98 to a disengaged position, shown in FIG. 4A, to then allow lever 42 to pivot in unlatching direction 68 by the force of spring 76 as shown in FIG. 4B. Note, however, because of the reverse angle of catch 54 and leading catch 56, pivoting button 50 in the direction of arrow 98 initially causes lever 42 to pivot a short distance in latching direction 100 (as indicated in FIG. 4A) and against the bias of spring 76. This helps to keep lever 42 properly engaged with button 50 until the user actively disengages the two.

Once lever 42 is in the unlatched position of FIG. 4C, electronic module 6 is inserted further within housing 10 so that bight 66 of keeper 8 enters the U-shaped opening defined by U-shaped camming surface 64. Lever 42 is then rotated in latching direction 100 until lever 42 is in the latched position of FIG. 3; this movement initially causes camming surface 64 to engage bight 66 in a manner which tends to force keeper 8 away from housing 10 against the bias of springs 70. After keeper 8 is fully extended, further movement of lever 42 in the latching direction 100 forces module 6 into housing 10, thus causing connectors 12, 14 to mate.

Catch end 44 of lever 42 includes an angled guide surface 102. When lever 42 is rotated in latching direction 100, guide surface 102 engages the outer edge 104 of button 50 to bias button 50 in the direction of arrow 98; continued movement of lever 42 in latching direction 100 permits button 50 to rotate back in the direction of an arrow 106 (see FIG. 4B) so that reverse angle catch 54 assumes a position opposite mating catch 56. Upon release of lever 42, spring 76 and springs 70 urge catch 56 against catch 54 thus securing module 6 to housing 10.

To remove module 6, the user presses on serrated surface 108 of button 50 to bias button 50 in the direction of arrow 98, thus releasing lever 42. Lever 42 is initially biased in unlatching direction 68 by springs 70, 76. The bias of the springs ceases when lever 42 is at an angle of about 20 degrees to bight 24. Simultaneously, during the initial movement of lever 42 in unlatching direction 68, disenable switch pin 72 is driven away from enable switch 96 by spring 76. This causes enable switch 96 to be released so to electrically isolate module 6 from housing 10 prior to the disconnection of connectors 10, 12. Further movement of lever 42 in unlatching direction 68 by the user causes camming surface 64 to push against bight 66, thus forcing electronic module 6 away from housing 10, thus disconnecting connectors 12, 14. The user can then pull on handle 18 to completely remove module 6 from housing 10.

Modification and variation can be made to the disclosed embodiment without departing from the subject of the invention as defined in the following claims.

What is claimed is:

1. An electronic module and integrally mounted latch assembly disposed in a housing, the electronic module including an enabling switch, the electronic module latch assembly comprising:
    a U-shaped handle having a first leg, a second leg and a bight connecting the first and second legs, the first and second legs secured to the module, the handle defining a handle plane;
    a lever having a latch end and a catch end, the latch end pivotally secured to the handle for pivotal movement in latching and unlatching rotary directions along the handle plane between a latched position, generally parallel to the bight, and an unlatched position, extending away from the bight, the lever sized so that the latch end is adjacent the first leg when the lever is in the latched position;
    a catch button having a first catch, facing the catch end, movably mounted to the handle for movement between engaged and disengaged positions;
    the catch end including a second catch configured for mating engagement with the first catch when the first catch is in the engaged position and the lever is in the latched position so to prevent movement of the lever in the unlatching direction;
    a keeper, having a latch surface, mounted to the housing;
    the latch end of the lever including latch means for engaging the latch surface to pull the module into and force the module from the housing when the lever is rotated in the latching and unlatching directions, respectively; and
    a spring biased disenable switch element movably mounted to the handle to engage the lever so to move between enable and disenable positions as the lever is moved between the latched and unlatched positions, respectively, the disenable switch element sized to extend to the enable switch to actuate the enable switch carried by the module only when the switch element is in the enable position.

2. The electronic module and integrally mounted latch assembly of claim 1 wherein the bight of the handle includes a slot for at least partially housing the lever when the lever is in the latched position.

3. The electronic module and integrally mounted latch assembly of claim 1 wherein the first leg includes an open interior region within which at least a portion of the catch button is housed.

4. The electronic module and integrally mounted latch assembly of claim 1 wherein the disenable switch element includes an elongate pin having an outer end positioned to engage a lower surface of the lever.

5. The electronic module and integrally mounted latch assembly of claim 1 wherein the catch button is a spring biased catch button biased towards the engaged position.

6. The electronic module and integrally mounted latch assembly of claim 1 wherein the latch means includes a U-shaped internal surface configured to engage the latch surface of the keeper.

7. The electronic module and integrally mounted latch assembly of claim 1 wherein the keeper is generally U-shaped.

8. The electronic module and integrally mounted latch assembly of claim 1 wherein the keeper includes means for resiliently mounting the latch surface to the housing.

9. The electronic module and integrally mounted latch assembly of claim 1 wherein the latch end of the lever is pivotally secured to the second leg of the handle.

10. An electronic module and integrally mounted latch assembly disposed in a housing, the electronic module including an enabling switch, the electronic module latch assembly comprising:
    an enable switch housed within the electric module;
    a U-shaped handle having a first leg, a second leg and a bight connecting the first and second legs, the first and second legs secured to the module, the handle defining a handle plane;
    a lever having a lower surface, latch end and a catch end, the latch end pivotally secured to the handle for pivotal movement in latching and unlatching rotary directions along the handle plane between a latched position, generally parallel to the bight, and an unlatched position, extending away from the bight, the lever sized so that the latch end is adjacent the first leg when the lever is in the latched position;
    a catch button having a first catch, facing the catch end, movably mounted to the handle for movement between engaged and disengaged positions;
    the catch end including a second catch configured for mating engagement with the first catch when the first catch is in the engaged position and the lever is in the latched position so to prevent movement of the lever in the unlatching direction;
    a keeper, having a latch surface, mounted to the housing;
    means for biasing the latch surface towards the housing;
    the latch end of the lever including latch means for engaging the latch surface to pull the module into and force the module from the housing when the lever is rotated in the latching and unlatching directions, respectively; and
    a spring biased elongate pin, including outer and inner ends, movably mounted to the handle so the outer end engages the lower surface of the lever so to move between the latched and unlatched positions, respectively, the elongate pin housed within the handle and sized so the inner end extends into the module to actuate the enable switch carried by the module only when the elongate pin is in the enable position.

* * * * *